US012272617B2

(12) United States Patent
Lin et al.

(10) Patent No.: US 12,272,617 B2
(45) Date of Patent: Apr. 8, 2025

(54) HEAT DISSIPATION FASTENER STRUCTURE

(71) Applicant: ASIA VITAL COMPONENTS CO., LTD., New Taipei (TW)

(72) Inventors: Sheng-Huang Lin, New Taipei (TW); Chii-Ming Leu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 260 days.

(21) Appl. No.: 18/133,505

(22) Filed: Apr. 11, 2023

(65) Prior Publication Data

US 2024/0347419 A1    Oct. 17, 2024

(30) Foreign Application Priority Data

May 31, 2022 (TW) .................................. 111120243

(51) Int. Cl.
*H01L 23/40* (2006.01)
(52) U.S. Cl.
CPC .. *H01L 23/4006* (2013.01); *H01L 2023/4043* (2013.01); *H01L 2023/4087* (2013.01)
(58) Field of Classification Search
CPC ......... H01L 23/4006; H01L 2023/4043; H01L 2023/4087; H01L 23/427
USPC ....................................................... 165/80.2
See application file for complete search history.

(56) References Cited

U.S. PATENT DOCUMENTS

| 11,291,115 | B2 * | 3/2022 | Ferguson | ............... H01R 12/88 |
| 2013/0342997 | A1 | 12/2013 | Yeh | |
| 2014/0071647 | A1 * | 3/2014 | Bridges | ................... H01L 23/40 |
| | | | | 361/783 |
| 2016/0285184 | A1 * | 9/2016 | Liu | ..................... H01R 12/7058 |
| 2018/0166807 | A1 * | 6/2018 | Boyd | ................. H01R 12/7076 |
| 2020/0126889 | A1 | 4/2020 | Mao et al. | |

FOREIGN PATENT DOCUMENTS

| TW | M453173 U | 5/2013 |
| TW | M526097 U | 7/2016 |
| TW | M569127 U | 10/2018 |
| TW | M633097 | 10/2022 |

OTHER PUBLICATIONS

Search Report dated Jun. 21, 2023 issued by Taiwan Intellectual Property Office for counterpart application No. 111120243.

* cited by examiner

*Primary Examiner* — Jon T. Schermerhorn, Jr.
(74) *Attorney, Agent, or Firm* — Demian K. Jackson; Jackson IPG PLLC

(57) ABSTRACT

A heat dissipation fastener structure includes a support body, a heat sink, a cover body and an operation unit assembly. The support body comprises a window formed on an upper side and support legs extended from a lower side to together define a reciprocating space in communication with the window. The heat sink is formed with perforations at four corners and disposed in the reciprocating space. Threaded locking members, around which elastic members are fitted, are correspondingly passed through the perforations to mount the heat sink above a heat source in a floating state. The cover body is disposed on the support body and comprises at least one vertical folded edge. The operation unit assembly is disposed on the heat sink to drive the cover body to shield the threaded locking members and make the heat sink get close to or away from the heat source.

9 Claims, 8 Drawing Sheets

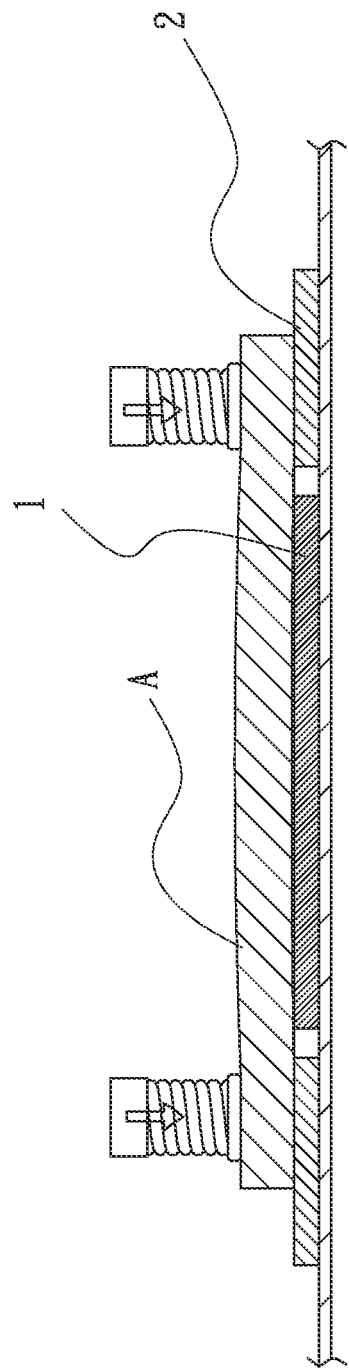
(Prior Art) Fig. 1b (A-A Profile)

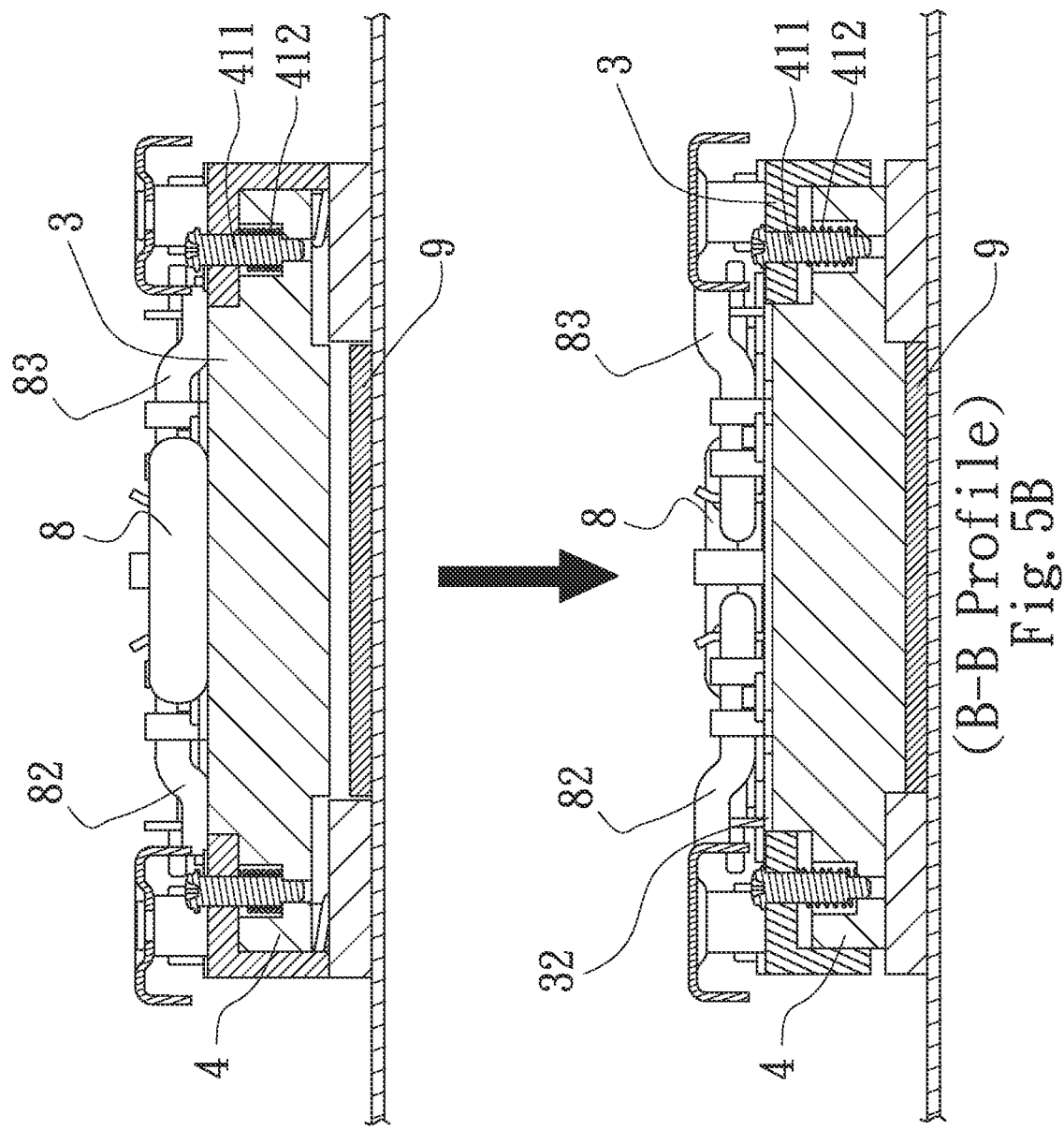

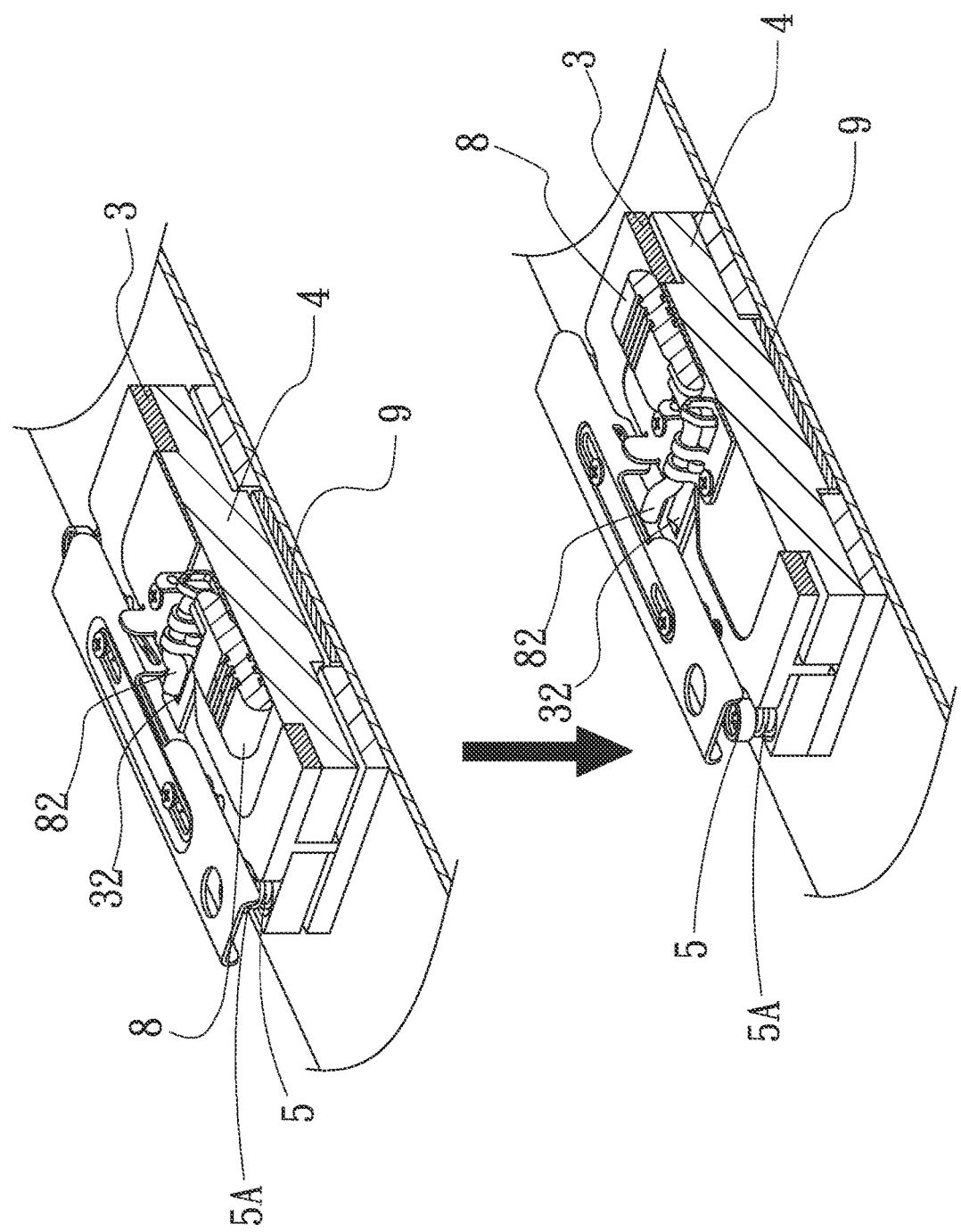

HEAT DISSIPATION FASTENER STRUCTURE

This application claims the priority benefit of Taiwan patent application number 111120243 filed on May 31, 2022.

BACKGROUND OF THE INVENTION

1. Field of the Invention

The present invention relates generally to a heat dissipation fastener structure, and more particularly to a heat dissipation fastener structure, which can make a heat sink more tightly attach to a heat source in the form of a die.

2. Description of the Related Art

A heat conduction component and a heat dissipation component are often combined with each other to contact a heat source and conduct the heat generated by the heat source. A heat pipe or a vapor chamber is often selectively used as the heat conduction component to uniformly conduct out the heat generated by the heat source or conduct the heat generated by the heat source to a remote end for dissipating the heat. Both the heat pipe and the vapor chamber necessitate a base seat for securing the heat pipe and the vapor chamber. Alternatively, a base seat and a securing seat disposed around the heat source are needed for securing the heat pipe and the vapor chamber.

Please refer to FIGS. 1a and 1b. FIG. 1a is a perspective exploded view of a conventional thermal module. FIG. 1b is a sectional assembled view of the conventional thermal module. A conventional motherboard has at least one heat source 1 thereon. A heat sink A corresponding to the heat source 1 is used to contact the heat source 1 for dissipating the heat generated by the heat source 1. In order to securely assemble the heat sink A with the heat source 1, a securing seat 2 is disposed around the heat source 1. Four corners of the heat sink A are correspondingly locked and connected with the securing seat 2 by means of screws, whereby the heat sink A can attach to the heat source 1 to conduct and dissipate the heat generated by the heat source 1.

Currently, in order to provide high-performance operation ability for an electronic device, the electronic device always employs a high-power chip with high performance. In operation, the chip will generate a great amount of heat. A conventional operation chip is packaged with a packaging case for enclosing the chip to avoid damage of the chip. Along with the enhancement of operation performance of the chip, when the chip operates and works, the temperature of the chip will even more rise than a traditional chip. Moreover, the packaging case enclosing the chip will affect the outward heat conduction and heat dissipation efficiency of the chip. Therefore, most of the chips have been changed to be arranged in the electronic device in the form of a die. The surface of the die is free from the protective packaging case and the surface of the die is not an even surface. Therefore, when the heat sink A is secured to the upper side of the heat source 1 (the die) to contact the heat source 1, it is necessary to one by one adjust the locking points and the locking force so as to ensure that the heat sink A tightly attaches to the heat source 1 and prevent the heat source 1 (the die) from being fractured and broken due to excessively great locking force. However, in the assembling process, the screws are manually tightened with an electrical screwdriver or tightened by an electrical screwdriver operated by a robotic arm. Therefore, the assembling process in the production line is performed by a very fast speed. As a result, it is impossible to one by one sequentially lock and tighten the screws in opposite corner direction and one by one adjust the tightening force. Instead, all the screws are quickly locked and tightened on point at one time. Under such circumstance, the heat sink A can be hardly truly evenly attached to the upper side of the heat source 1. Also, it cannot be ensured that the heat sink A is locked with the heat source 1 by a proper locking force.

Furthermore, the screws are not locked and tightened in the opposite corner direction. This often leads to that only four corners of the heat sink A are tightly connected and attached to the securing seat 2, while the central portion of the heat sink A is upward raised and deformed due to the downward pressing force of the periphery of the heat sink A. Therefore, a gap exists between the raised central portion of the heat sink A and the heat source 1 correspondingly positioned at the center of the heat sink A. As a result, the raised central portion of the heat sink A can hardly tightly attach to the heat source 1 to cause thermal resistance. In this case, the heat sink A cannot evenly absorb the heat of the heat source 1 or even the heat sink A will lose its heat conduction function.

In addition, in the conventional technique, after the heat sink A is secured to the heat source 1 by means of the threaded locking members, during the production process, a problem often takes place that the products and the semi-products in the production line are mixed with each other or after installed, different operators can hardly judge whether the heat sink A is securely locked on the upper side of the heat source 1. An operator can hardly judge with bare eyes whether the threaded locking members have been completely locked or unlocked and loosened by somebody else. Both situations are unacceptable that the threaded locking members are over-tightened to apply excessively great locking force to the heat sink A and the heat source 1 or the threaded locking members are not completely tightened. Therefore, the conventional technique has a critical shortcoming that the products and the semi-products are mixed with each other or an operator cannot immediately judge with bare eyes whether the threaded locking members are unexpectedly unlocked by someone else. This shortcoming of the conventional technique must be improved.

It is therefore tried by the applicant to provide a heat dissipation fastener structure, which enables the heat sink A to fully tightly attach to the heat sink 1 and prevents the products from being error-unlocked by someone else. The heat dissipation fastener structure of the present invention also prevents the products and the semi-products from mixing with each other to make an operator fail to judge with bare eyes whether the threaded locking members are unexpectedly unlocked by someone else.

SUMMARY OF THE INVENTION

It is therefore a primary object of the present invention to provide a heat dissipation fastener structure, which includes a support body, a heat sink, a cover body and an operation unit assembly. An upper side of the support body is formed with a window and an abutment section. Multiple support legs extend from a periphery of a lower side of the support body. The support legs stand around a heat source to together define a reciprocating space in communication with the window. The support legs stand around a heat source. The heat sink has an upper face and a lower face. Each of four corners of the heat sink is formed with at least one perforation. The heat sink is disposed in the reciprocating space of the support body with the upper face protruding from the window. Multiple threaded locking members, around which multiple elastic members are fitted, are correspondingly passed through the perforations to mount the heat sink above the heat source in a floating state. The cover body is correspondingly disposed on the upper side of the support body. At least one folded edge vertically extends from a lateral side of the cover body. The folded edge has a reception section. The operation unit assembly is disposed on the upper face of the heat sink. By means of operating the operation unit assembly, the reception section of the cover body is driven to move the cover body to shield the threaded locking members and make the heat sink get close to or away from the heat source.

In the conventional heat dissipation fastener, the heat sink is directly pressed against the heat source (the die) at one time so that the heat sink cannot evenly attach to the heat source to apply uniform force to the heat source. Moreover, the pressing force is applied to the heat source at one time so that the heat source in the form of a die without any protective shield is apt to be fractured. In contrast, according to the design of the present invention, the heat sink contacts the heat source by a gentle and proper contact force. Therefore, the heat sink can tightly attach to the heat source in the form of a die with uneven surface by a uniform force. Moreover, by means of the structure of the present invention, the heat sink can gently contact and attach to the heat source to prevent the heat source from being fractured and damaged due to excessively great pressing force. When operating the operation unit assembly, not only the heat sink is driven to gently and stably contact the heat source to gently and tightly attach to the heat source, but also the reception section of the cover body is driven at the same time so as to move the cover body to shield the threaded locking members and avoid error-unlocking thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 1b is a sectional assembled view of the conventional thermal module;

FIG. 5B is a sectional view taken along line B-B of FIG. 4, showing the first embodiment of the heat dissipation fastener structure of the present invention; and FIG. 6 is a perspective sectional view of the heat dissipation fastener structure of the present invention.

DETAILED DESCRIPTION OF THE PREFERRED EMBODIMENTS

Figure 1A:
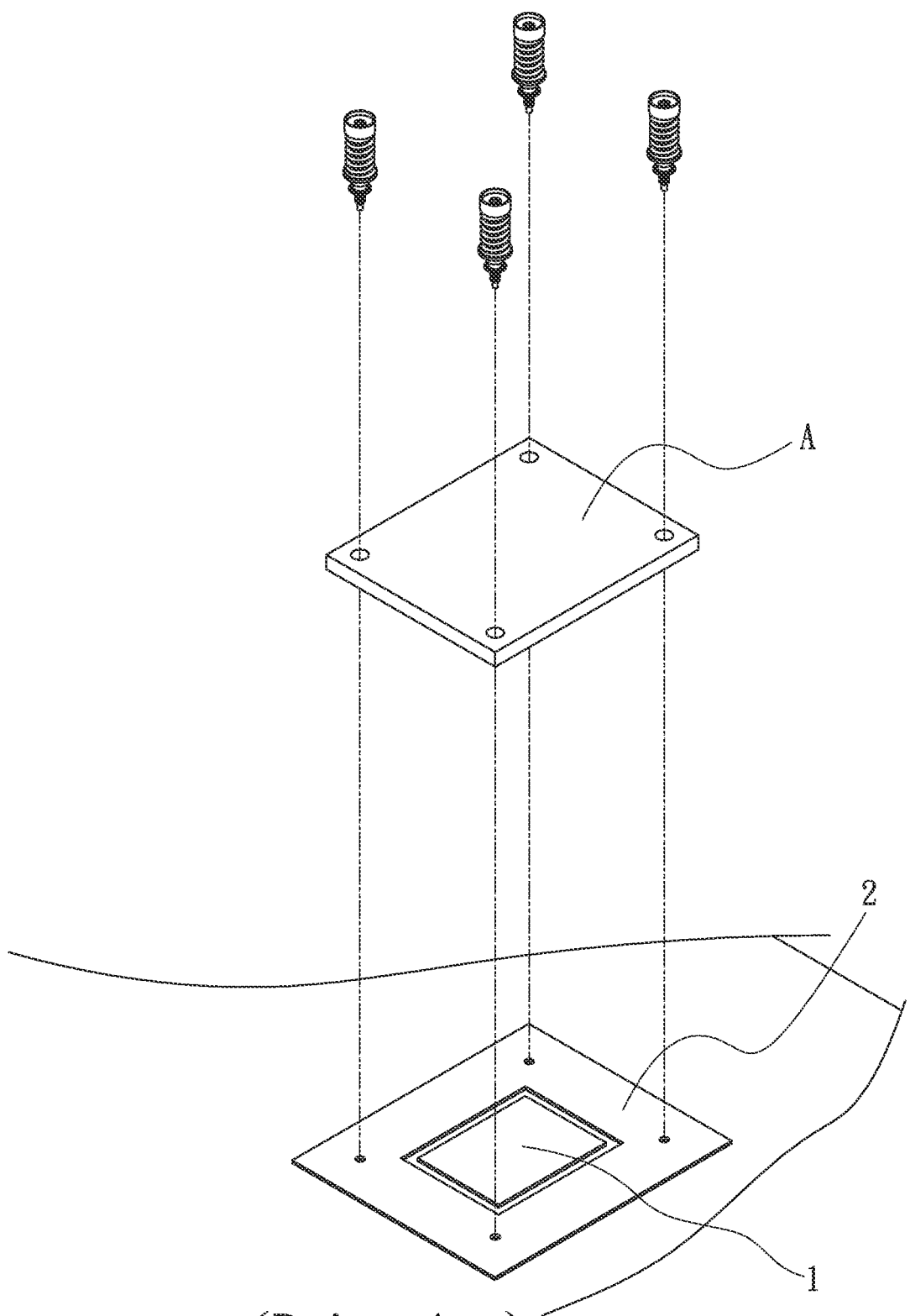
FIG. 1a is a perspective exploded view of a conventional thermal module.
Figure 2:
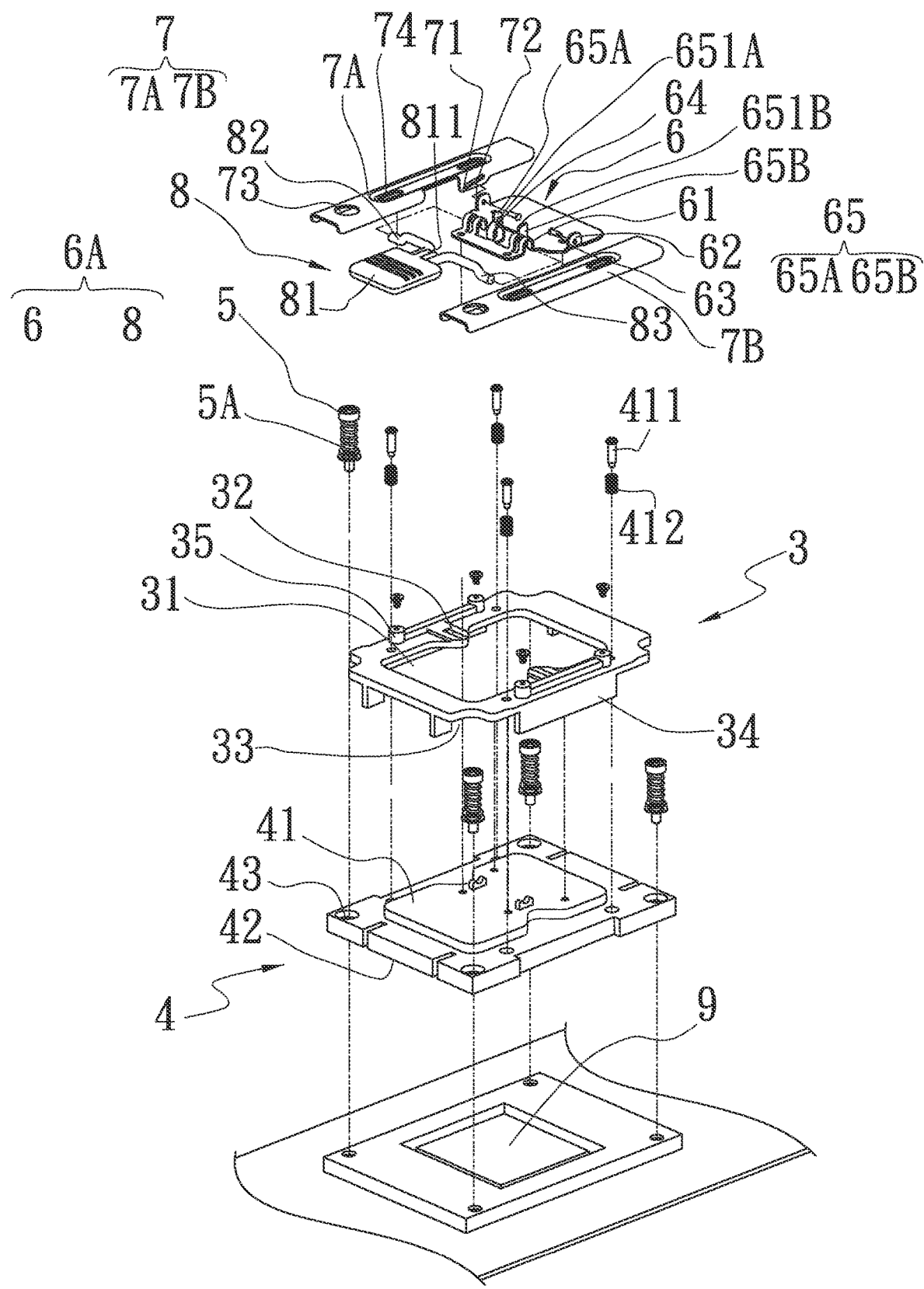
FIG. 2 is a perspective exploded view of a first embodiment of the heat dissipation fastener structure of the present invention.
Figure 3:
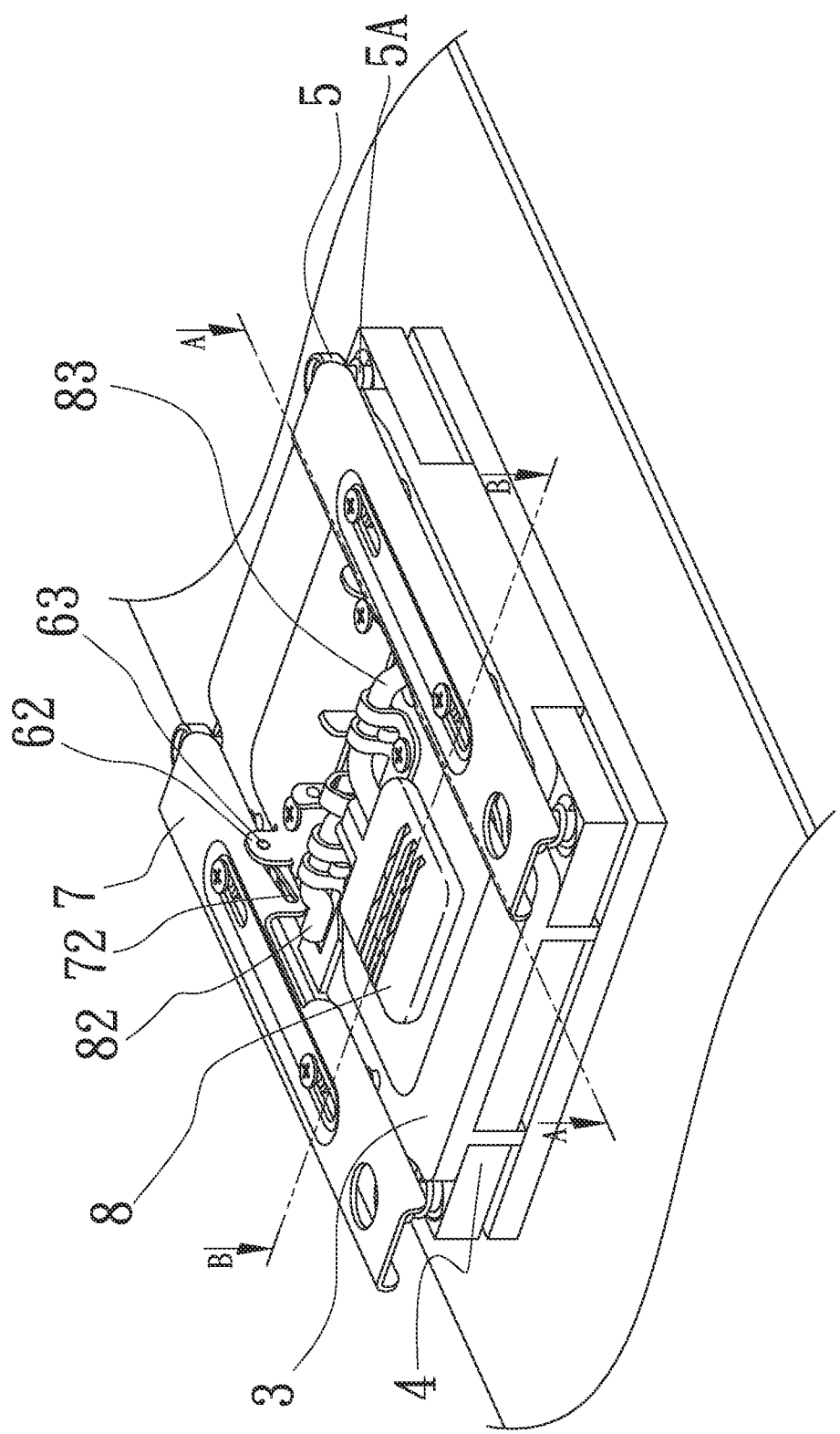
FIG. 3 is a perspective assembled view of the first embodiment of the heat dissipation fastener structure of the present invention.
Figure 4:
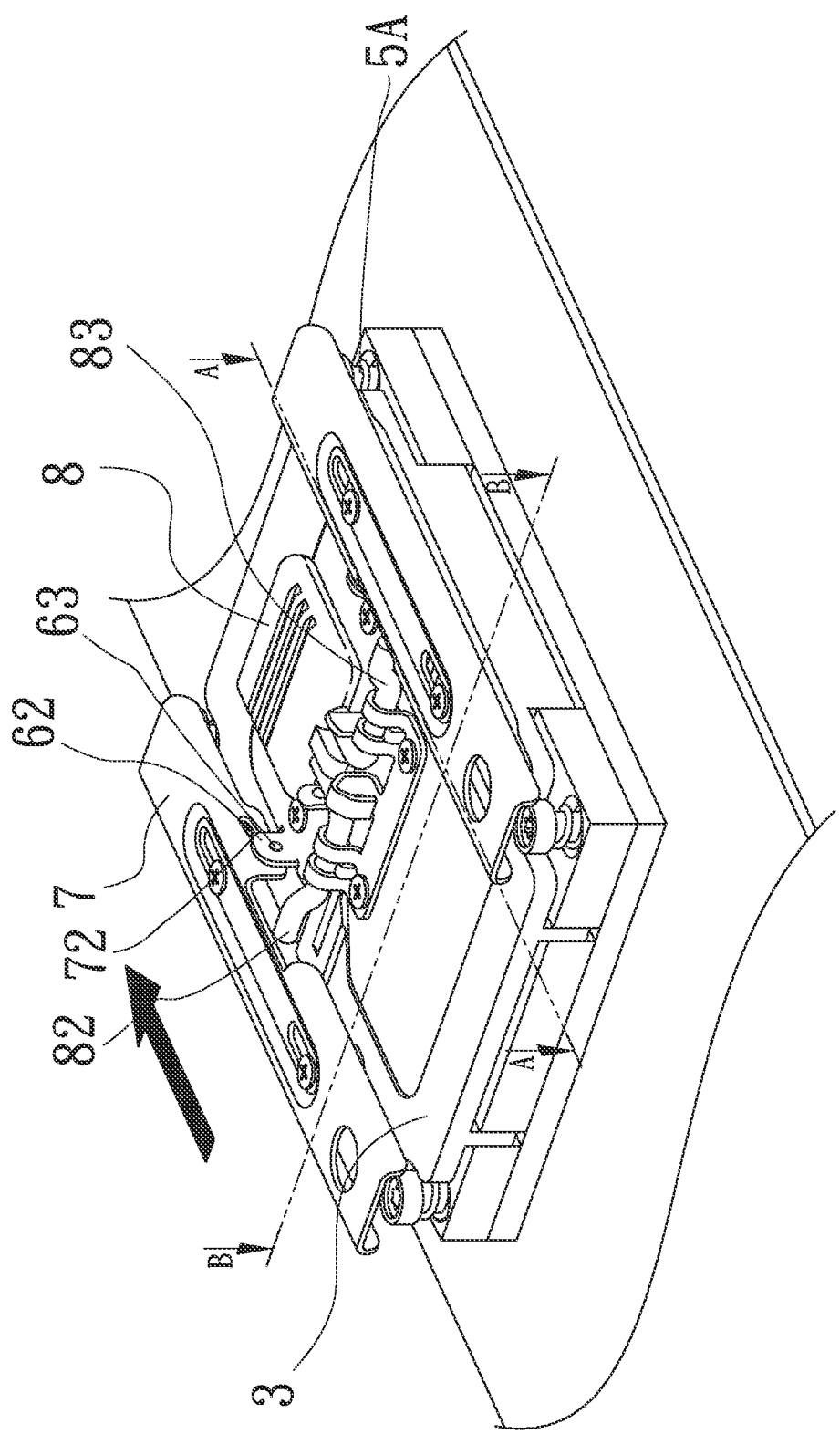
FIG. 4 is another perspective assembled view of the first embodiment of the heat dissipation fastener structure of the present invention.
Figure 5A:
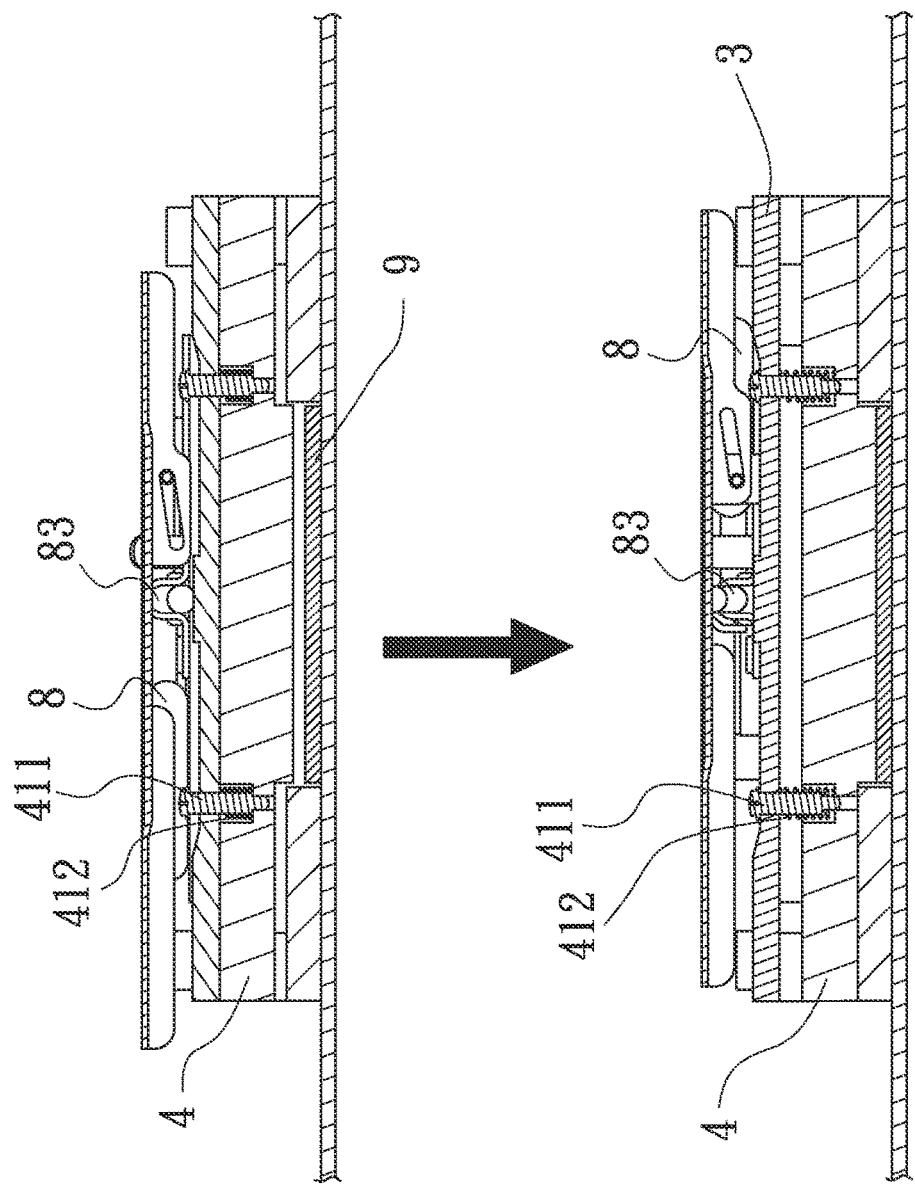
FIG. 5A is a sectional view taken along line A-A of FIG. 4, showing the first embodiment of the heat dissipation fastener structure of the present invention.

Please refer to FIGS. 2, 3, 4, 5A and 5B. FIG. 2 is a perspective exploded view of a first embodiment of the heat dissipation fastener structure of the present invention. FIG. 3 is a perspective assembled view of the first embodiment of the heat dissipation fastener structure of the present invention. FIG. 4 is another perspective assembled view of the first embodiment of the heat dissipation fastener structure of the present invention. FIG. 5A is a sectional view taken along line A-A of FIG. 4, showing the first embodiment of the heat dissipation fastener structure of the present invention. FIG. 5B is a sectional view taken along line B-B of FIG. 4, showing the first embodiment of the heat dissipation fastener structure of the present invention. As shown in the drawings, the heat dissipation fastener structure of the present invention includes a support body 3, a heat sink 4, multiple threaded locking members 5, an operation unit assembly 6A, a cover body 7 and an operation member 8.

An upper side of the support body 3 is formed with a window 31 and an abutment section 32. Multiple support legs 34 are disposed along a periphery of a lower side of the support body 3. The support legs 34 stand around a heat source 9 to together define a reciprocating space 33 in communication with the window 31.

The heat sink 4 has an upper face 41 and a lower face 42. Each of four corners of the heat sink 4 is formed with at least one perforation 43. The perforations 43 pass through the heat sink 4 between the upper and lower faces 41, 42. The heat sink 4 is disposed in the reciprocating space 33 of the support body 3 with the upper face 41 protruding from the window 31.

The heat sink 4 is locked and connected with a corresponding securing base seat or a circuit board or a heat conduction member.

An elastic member 5A is fitted around each of the threaded locking members 5. The threaded locking members 5 are correspondingly passed through the perforations 43 to mount the heat sink 4 above the heat source 9 in a floating state. The elastic members 5A serve to push the heat sink 4 to approach and attach to the heat source 9.

The operation unit assembly 6A is disposed on the upper face 41 of the heat sink 4 and connected with the heat sink 4 by means of screws, welding or riveting. The operation unit assembly 6A has an operation member 8 and an operation member securing support 6. By means of the operation member securing support 6, the operation member 8 is pivotally disposed on the upper face 41 of the heat sink 4. The operation member securing support 6 has multiple locating ring bodies 61 and two linking sections 62 uprightly disposed on two sides of the operation member securing support 6. At least one linking member 63 is inserted in each linking section 62. The operation member 8 has a shift plate 81 connected with a first extension rod body 82 and a second extension rod body 83. The middle portions of the first and second extension rod bodies 82, 83 of the operation member 8 are pivotally disposed in the locating ring bodies 61. Accordingly, the operation member 8 can be operated and shifted by 0~180 degrees to drive the free ends of the first and second extension rod bodies 82, 83 to separate from or into contact with the abutment section 32 of the support body 3, whereby the abutment section 32 can release the heat sink 4 without lifting the heat sink 4 and the elastic members 5A can apply elastic force to the heat sink 4 to contact the heat source 9.

The cover body 7 is correspondingly disposed on the upper side of the support body 3. At least one folded edge 71 vertically extends from a lateral side of the cover body 7. The folded edge 71 has a reception section 72. In this embodiment, the reception section 72 is, but not limited to, a slot for illustration. The cover body 7 can be an integrated piece or an assembly composed of multiple pieces. In this embodiment, the cover body 7 is, but not limited to, an assembly composed of multiple pieces for illustration. The cover body 7 includes a left side main body 7A and a right side main body 7B. The left side and right side main bodies 7A, 7B are selectively connected with each other or independently arranged. Each of the left side and right side main bodies 7A, 7B has at least one through hole 73 and a slide slot 74. Multiple horizontally locating sections 35 are disposed on the upper side of the support body 3 corresponding to the slide slots 74. The horizontally locating sections 35 can horizontally displace within the slide slots 74. The slot 72 on the folded edge 71 is inclined to help in horizontally moving the cover body 7 relative to the support body 3.

The linking member 63 is inserted in the linking section 62 corresponding to the reception section 72 of the folded edge 71 of the cover body 7. The linking member 63 is movably correspondingly passed through the reception section 72 of folded edge 71 to drive the cover body 7 to horizontally move relative to the support body 3. In addition, the linking member 63 forces the cover body 7 to move to shield the threaded locking members 5 so as to avoid error-unlocking of the threaded locking members 5.

The operation member securing support 6 further has a buffering member 64 and a restriction support 65. The buffering member 64 is disposed between the locating ring bodies 61 corresponding to an extension section 811 extending from the shift plate 81. The restriction support 65 includes a first support body 65A and a second support body 65B arranged in parallel to each other. The first support body 65A has a first boss 651A and the second support body 65B has a second boss 651B. The first and second extension rod bodies 82, 83 can be correspondingly engaged between the first and second support bodies 65A, 65B and restricted and secured by the first and second bosses 651A, 651B so as to prevent the first and second extension rod bodies 82, 83 from rebounding back to the operation original position.

The buffering member 64 serves to restrict the shift plate 81 from being quickly shifted from the start point (zero degree) of the operation member 8 to the end point (180 degree) and provide a buffering function.

A receiving space is defined between the heat sink 4 and the heat source 9. At least one heat conduction member can be disposed in the receiving space. The heat conduction member is a heat pipe or a vapor chamber. The heat conduction member is passed through and assembled with the heat sink 4. Alternatively, the heat conduction member is attached to the lower face 42 of the heat sink 4 by way of lay-up to contact and connect with the heat source 9.

Please refer to FIGS. 5A, 5B and 6. The support body 3 of the present invention is first positioned around the heat source 9 as a support point. The threaded locking members 5 are passed through the perforations 43 of the four corners of the heat sink 4 to secure the heat sink 4 above the heat source 9. The elastic members 5A fitted around the threaded locking members 5 lift and support the heat sink 4. Multiple locating posts 411 and multiple compression springs 412 are disposed on the upper face 41 of the heat sink 4. The compression springs 412 are fitted around the locating posts 411. Two ends of the compression springs 412 respectively abut against the upper face 41 of the heat sink 4 and the lower side of the support body 3 to make the heat sink 4 approach to the heat source 9. The free ends of the first and second extension rod bodies 82, 83 of the operation member 8 are in contact with the abutment section 32 of the support body 3 and the first and second extension rod bodies 82, 83 of the operation member 8 are not straight rod bodies. Accordingly, there is a height difference between the middle portions of the first and second extension rod bodies 82, 83 and the free ends of the first and second extension rod bodies 82, 83. Therefore, in an initial state, under leverage, the heat sink 4 is upward lifted. When operating the shift plate 81 of the operation member 8, the free ends of the first and second extension rod bodies 82, 83 are separated from the abutment section 32 so that the first and second extension rod bodies 82, 83 release the heat sink 4. At this time, the elastic members 5A force the heat sink 4 to attach to the heat source 9. The heat source 9 may have the form of a die without any protective shield. Therefore, a one-time pressing force is apt to break the heat source 9 in the form of a die. In contrast, according to the present invention, the operation member 8 gradually releases the heat sink 4 to approach and attach to the heat source 9. This not only prevents the heat source 9 from being compressed and damaged, but also provides uniform and snug downward pressing force for the heat source 9 in the form of a die with an uneven surface. Also, when operating the operation member 8, the reception section of the cover body is driven at the same time so as to move the cover body to shield the threaded locking members and avoid error-unlocking thereof.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation fastener structure comprising:
   a support body, an upper side of the support body being formed with a window and an abutment section, multiple support legs extending from a periphery of a lower side of the support body, the support legs together defining a reciprocating space in communication with the window, the support legs standing around a heat source;
   a heat sink having an upper face and a lower face, each of four corners of the heat sink being formed with at least one perforation, the heat sink being disposed in the reciprocating space of the support body with the upper face protruding from the window of the support body;
   multiple threaded locking members, an elastic member being fitted around each of the threaded locking members, the threaded locking members being correspondingly passed through the perforations to mount the heat sink above the heat source in a floating state;
   a cover body correspondingly disposed on the upper side of the support body, at least one folded edge vertically extending from a lateral side of the cover body, the folded edge having a reception section; and
   an operation unit assembly disposed on the upper face of the heat sink, by means of operating the operation unit assembly, the reception section of the cover body is driven to move the cover body to shield the threaded locking members, also, by means of operating the operation unit assembly, the heat sink being driven to get close to or away from the heat source.

2. The heat dissipation fastener structure as claimed in claim 1, wherein the cover body includes a left side main body and a right side main body, the left side and right side main bodies being selectively connected with each other or independently arranged, each of the left side and right side main bodies having at least one through hole and a slide slot, multiple horizontally locating sections being disposed on the upper side of the support body corresponding to the slide slots, whereby the horizontally locating sections can horizontally displace within the slide slots.

3. The heat dissipation fastener structure as claimed in claim 1, wherein the operation unit assembly has an operation member and an operation member securing support, by means of the operation member securing support, the operation member being pivotally disposed on the upper face of the heat sink, the operation member securing support having multiple locating ring bodies and two linking sections uprightly disposed on two sides of the operation member securing support, the operation member having a shift plate connected with a first extension rod body and a second extension rod body, middle portions of the first and second extension rod bodies of the operation member being pivotally disposed in the locating ring bodies, whereby the operation member can be operated and shifted by 0~180 degrees to drive free ends of the first and second extension rod bodies to separate from or into contact with the abutment section of the support body, so that the abutment section can release the heat sink without lifting the heat sink and the elastic members can apply elastic force to the heat sink to contact the heat source.

4. The heat dissipation fastener structure as claimed in claim 1, wherein the first and second extension rod bodies of the operation member are not straight rods so that there is a height difference between the middle portions of the first and second extension rod bodies and the free ends of the first and second extension rod bodies.

5. The heat dissipation fastener structure as claimed in claim 1, wherein the perforations pass through the heat sink between the upper and lower faces thereof.

6. The heat dissipation fastener structure as claimed in claim 1, wherein multiple locating posts and multiple compression springs are disposed on the upper face of the heat sink, the compression springs being fitted around the locating posts, two ends of the compression springs respectively abutting against the upper face of the heat sink and the lower side of the support body.

7. The heat dissipation fastener structure as claimed in claim 1, wherein the reception section of the folded edge is in the form of an inclined slot.

8. The heat dissipation fastener structure as claimed in claim 3, wherein the operation member securing support further has a buffering member and a restriction support, the buffering member being disposed between the locating ring bodies corresponding to an extension section extending from the shift plate, the restriction support including a first support body and a second support body arranged in parallel to each other, the first support body having a first boss and the second support body has a second boss, whereby the first and second extension rod bodies can be correspondingly engaged between the first and second support bodies and restricted and secured by the first and second bosses, at least one linking member being inserted in each linking section corresponding to the reception section of the cover body, the linking member being movably correspondingly passed through the reception section of folded edge to drive the cover body to horizontally move relative to the support body.

9. The heat dissipation fastener structure as claimed in claim 1, wherein each of the free ends of the first and second extension rod bodies of the operation member is formed with a bent section corresponding to the reception section of the folded edge of the cover body, the bent sections of the first and second extension rod bodies being correspondingly passed through the reception section of the folded edge to drive the cover body to horizontally move relative to the support body.

* * * * *